United States Patent
Collados Asensio et al.

(10) Patent No.: US 9,054,643 B2
(45) Date of Patent: Jun. 9, 2015

(54) METHOD AND APPARATUS FOR CALIBRATING AN ENVELOPE TRACKING SYSTEM

(71) Applicant: MediaTek Singapore Pte. Ltd., Singapore (SG)

(72) Inventors: Manel Collados Asensio, Aylesford (GB); Hsin-Hung Chen, Hsinchu County (TW); Jonathan Richard Strange, Reigate (GB)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/040,743

(22) Filed: Sep. 30, 2013

(65) Prior Publication Data

US 2014/0167843 A1     Jun. 19, 2014

Related U.S. Application Data

(60) Provisional application No. 61/739,195, filed on Dec. 19, 2012.

(51) Int. Cl.
| | |
|---|---|
| *H03F 1/02* | (2006.01) |
| *H04B 1/04* | (2006.01) |
| *H03G 1/00* | (2006.01) |

(52) U.S. Cl.
CPC . *H03F 1/02* (2013.01); *H04B 17/13* (2015.01)

(58) Field of Classification Search
CPC ..... H03F 1/02; H03F 2200/102; H03F 3/189; H03F 2200/451; H03F 1/0277; H03F 3/195; H03F 3/21; H03F 3/45475; H03F 2200/435; H03F 2200/555; H03F 2200/78; H03F 2203/45138; H03F 3/191; H04B 17/001; H04B 2001/0416; H04B 17/0005; H04B 17/0062; H04B 1/0483; H04B 1/10; H04B 2001/0408; H04B 24/00; H03G 3/004
USPC ......... 455/226.1, 574, 114.3, 127.1; 330/127, 330/136, 124 R, 75
See application file for complete search history.

(56) References Cited

U.S. PATENT DOCUMENTS

| | | | |
|---|---|---|---|
| 6,157,253 A | 12/2000 | Sigmon | |
| 7,884,681 B1 | 2/2011 | Khlat | |
| 8,093,945 B2 | 1/2012 | Wimpenny | |
| 8,824,981 B2* | 9/2014 | Langer et al. | 455/114.3 |
| 8,854,129 B2* | 10/2014 | Wilson | 330/136 |
| 2014/0057684 A1* | 2/2014 | Khlat | 455/574 |

(Continued)

*Primary Examiner* — Pablo Tran
(74) *Attorney, Agent, or Firm* — Winston Hsu; Scott Margo

(57) ABSTRACT

A method of calibrating an envelope tracking system for a supply voltage for a power amplifier module within a radio frequency (RF) transmitter module of a wireless communication unit. The method includes, within at least one signal processing module of the wireless communication unit, determining combinations of the power amplifier supply voltage and power amplifier input power that provide a power amplifier output power equal to a target output power, obtaining battery current indications for the determined combinations of the power amplifier supply voltage and power amplifier input power, selecting a combination of the power amplifier supply voltage and power amplifier input power that provide a power amplifier output power equal to a target output power based at least partly on the obtained battery current indications therefore, and calibrating the envelope tracking system using the selected combination of the power amplifier supply voltage and power amplifier input power.

18 Claims, 10 Drawing Sheets

(56) References Cited

U.S. PATENT DOCUMENTS

| | | | |
|---|---|---|---|
| 2014/0167841 A1* | 6/2014 | Henshaw et al. | 330/124 R |
| 2014/0179250 A1* | 6/2014 | Shute | 455/127.2 |
| 2014/0194080 A1* | 7/2014 | Li et al. | 455/226.1 |
| 2014/0266423 A1* | 9/2014 | Drogi et al. | 330/75 |

* cited by examiner

METHOD AND APPARATUS FOR CALIBRATING AN ENVELOPE TRACKING SYSTEM

CROSS REFERENCE TO RELATED APPLICATIONS

This application claims the benefit of U.S. provisional application No. 61/739,195, filed on Dec. 19, 2012 and incorporated herein by reference.

BACKGROUND

The field of this invention relates to a method and apparatus for calibrating an envelope tracking system, and in particular to a method and apparatus for calibrating an envelope tracking system for a supply voltage for a power amplifier module within a radio frequency (RF) transmitter module of a wireless communication unit.

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed. One technique known as envelope tracking relates to modulating the PA supply voltage to match (track) the envelope of the radio frequency waveform being transmitted by the RF PA. With envelope tracking, the instantaneous PA supply voltage (VPA) of the wireless transmitter is caused to approximately track the instantaneous envelope (ENV) of the transmitted RF signal. Thus, since the power dissipation in the PA is proportional to the difference between its supply voltage and output voltage, envelope tracking enables an increase in PA efficiency, reduced heat dissipation, improved linearity and increased maximum output power, whilst allowing the PA to produce the intended RF output.

FIG. 1 illustrates a graphical representation 100 of two alternative PA supply voltage techniques; a first technique that provides a fixed supply voltage 105 to a PA, and a second technique whereby the PA supply voltage is modulated to track the RF envelope waveform 115. In the fixed supply case, excess PA supply voltage headroom 110 is used (and thereby potentially wasted), irrespective of the nature of the modulated RF waveform being amplified. However, for example in the PA supply voltage tracking of the RF modulated envelope case 115, excess PA supply voltage headroom can be reduced 120 by modulating the RF PA supply, thereby enabling the PA supply to accurately track the instant RF envelope.

The mapping function between ENV and VPA is critical for optimum performance (efficiency, gain, and adjacent channel power (ACP)).

Envelope-tracking can be combined with digital pre-distortion (DPD) on the RF signal to improve ACP robustness. Since the ET system is often a multichip implementation involving function blocks in digital baseband (BB), analogue BB, RF transceiver, power management and PA, consistent ET system performance cannot easily be guaranteed across all devices by hardware. There is therefore a need for some level of transceiver calibration in order to accurately map and centre the ET performance of each device leaving the production line. To make envelope-tracking a cost-effective technology, it is desirable to minimize any extra production calibration time and/or use of external characterisation equipment.

Thus, there is a need for an efficient and cost effective solution to the problem of ET system calibration. In particular, it would be advantageous to deploy an auto-calibration method that utilises ENV to VPA mapping strategies that offer optimum or near optimum current consumption for different RMS output power levels to compensate for part-to-part variation, but which method preferably does not add any extra testing costs of significance.

SUMMARY

Accordingly, the invention seeks to mitigate, alleviate or eliminate one or more of the above mentioned disadvantages singly or in any combination. Aspects of the invention provide a method and apparatus for calibrating an envelope tracking system for a supply voltage for a power amplifier module within a radio frequency, RF, transmitter module of a wireless communication unit.

According to a first aspect of the invention, there is provided a method comprising, within at least one signal processing module of the wireless communication unit: determining combinations of the power amplifier supply voltage VPA and power amplifier input power Pi that provide a power amplifier output power Po equal to a target output power Po_t; obtaining battery current indications for the determined combinations of the power amplifier supply voltage VPA and power amplifier input power Pi that provide a power amplifier output power Po equal to a target output power Po_t; selecting a combination of the power amplifier supply voltage VPA and power amplifier input power Pi that provide a power amplifier output power Po equal to a target output power Po_t based at least partly on the obtained battery current indications therefore; and calibrating the envelope tracking system using the selected combination of the power amplifier supply voltage VPA and power amplifier input power Pi.

In this manner, by selecting a combination of the power amplifier supply voltage VPA and power amplifier input power Pi that provide a power amplifier output power Po equal to a target output power Po_t based at least partly on the obtained battery current indications therefore, power amplifier supply voltage VPA values may be derived that provide a more efficient mapping between an instantaneous envelope of a waveform signal to be amplified by the power amplifier module and the power amplifier module supply voltage.

According to a second aspect of the present invention there is provided a non-transitory computer program product comprising executable program code for calibrating an envelope tracking system for a supply voltage for a power amplifier module within a radio frequency, RF, transmitter module of a wireless communication unit, the executable program code operable for, when executed at a communication unit, performing the method of the first aspect of the present invention.

According to a third aspect of the present invention there is provided a communication unit comprising a radio frequency, RF, transmitter module comprising an envelope tracking system for a supply voltage for a power amplifier module within the RF transmitter module, and at least one signal processing module for calibrating envelope tracking system. The at least one signal processing module is arranged to: determine combinations of the power amplifier supply voltage VPA and power amplifier input power Pi that provide a power amplifier output power Po equal to a target output power Po_t; obtain battery current indications for the determined combinations of the power amplifier supply voltage VPA and power amplifier input power Pi that provide a power amplifier output power Po equal to a target output power Po_t; select a combination of the power amplifier supply voltage VPA and power amplifier input power Pi that provide a power amplifier output power Po equal to a target output power Po_t based at least partly on the obtained battery current indications therefore; and calibrate the envelope tracking system using the selected combination of the power amplifier supply voltage VPA and power amplifier input power Pi.

According to a fourth aspect of the present invention there is provided an integrated circuit for a communication unit comprising a radio frequency, RF, transmitter module comprising an envelope tracking system for a supply voltage for a power amplifier module within the RF transmitter module, and at least one signal processing module for calibrating envelope tracking system. The at least one signal processing module is arranged to: determine combinations of the power amplifier supply voltage VPA and power amplifier input power Pi that provide a power amplifier output power Po equal to a target output power Po_t; obtain battery current indications for the determined combinations of the power amplifier supply voltage VPA and power amplifier input power Pi that provide a power amplifier output power Po equal to a target output power Po_t; select a combination of the power amplifier supply voltage VPA and power amplifier input power Pi that provide a power amplifier output power Po equal to a target output power Po_t based at least partly on the obtained battery current indications therefore; and calibrate the envelope tracking system using the selected combination of the power amplifier supply voltage VPA and power amplifier input power Pi.

According to a fifth aspect of the present invention, there is provided a method of modulating a supply voltage for a power amplifier module within a radio frequency, RF, transmitter module of a wireless communication unit. The method comprises, within at least one signal processing module of the wireless communication unit: receiving user data to be transmitted by the transmitter module of the wireless communication unit; determining an output power waveform; generating a power amplifier supply voltage VPA waveform signal and a power amplifier input power Pi waveform signal from combinations of power amplifier supply voltage VPA and power amplifier input power Pi calibrated in accordance with the method of the first aspect of the present invention for individual points within the output power waveform; applying the power amplifier supply voltage VPA waveform signal to a voltage supply modulator for the power amplifier module; and generating an input signal for the RF transmitter module to achieve the power amplifier input power Pi waveform signal.

According to a sixth aspect of the present invention, there is provided a non-transitory computer program product comprising executable program code for modulating a supply voltage for a power amplifier module within a radio frequency, RF, transmitter module of a wireless communication unit, the executable program code operable for, when executed at a communication unit, performing the method of the fifth aspect of the present invention.

According to a seventh aspect of the present invention, there is provided a communication unit comprising: a radio frequency, RF, transmitter module comprising an envelope tracking system; the envelope tracking system comprising at least one signal processing module arranged to: receive user data to be transmitted by the transmitter module of the wireless communication unit; determine an output power waveform; generate a power amplifier supply voltage VPA waveform signal and a power amplifier input power Pi waveform signal from combinations of power amplifier supply voltage VPA and power amplifier input power Pi calibrated in accordance with the method of the fifth aspect of the present invention for individual points within the output power waveform; apply the power amplifier supply voltage VPA waveform signal to a voltage supply modulator for the power amplifier module; and generate an input signal for the RF transmitter module to achieve the power amplifier input power Pi waveform signal.

According to an eighth aspect of the present invention, there is provided an integrated circuit for a communication unit comprising a radio frequency, RF, transmitter module comprising an envelope tracking system; the envelope tracking system comprising at least one signal processing module arranged to: receive user data to be transmitted by the transmitter module of the wireless communication unit; determine an output power waveform; generate a power amplifier supply voltage VPA waveform signal and a power amplifier input power Pi waveform signal from combinations of power amplifier supply voltage VPA and power amplifier input power Pi calibrated in accordance with the method of the fifth aspect of the present invention for individual points within the output power waveform; apply the power amplifier supply voltage VPA waveform signal to a voltage supply modulator for the power amplifier module; and generate an input signal for the RF transmitter module to achieve the power amplifier input power Pi waveform signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that comprises or forms a part of an envelope tracking system. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
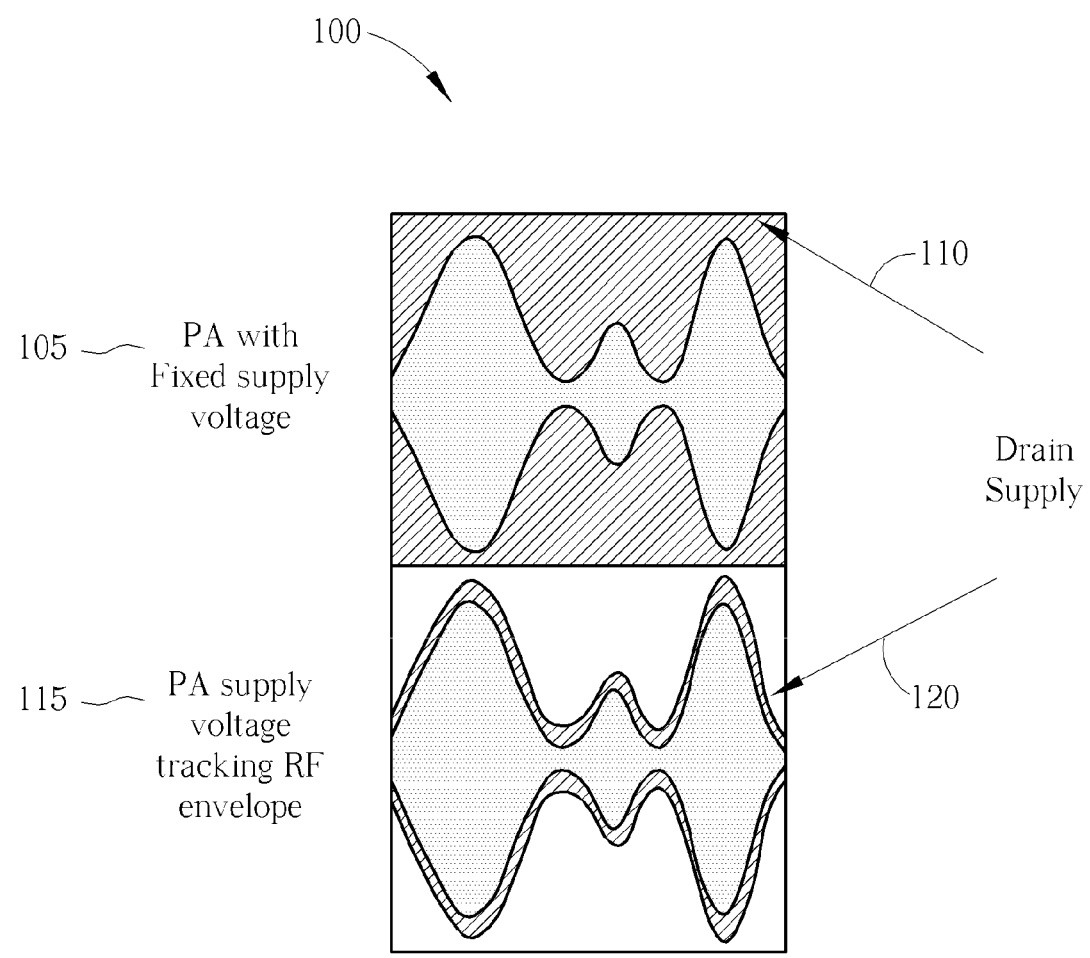
FIG. 1 illustrates a graphical representation of two alternative PA supply voltage techniques.
Figure 2:
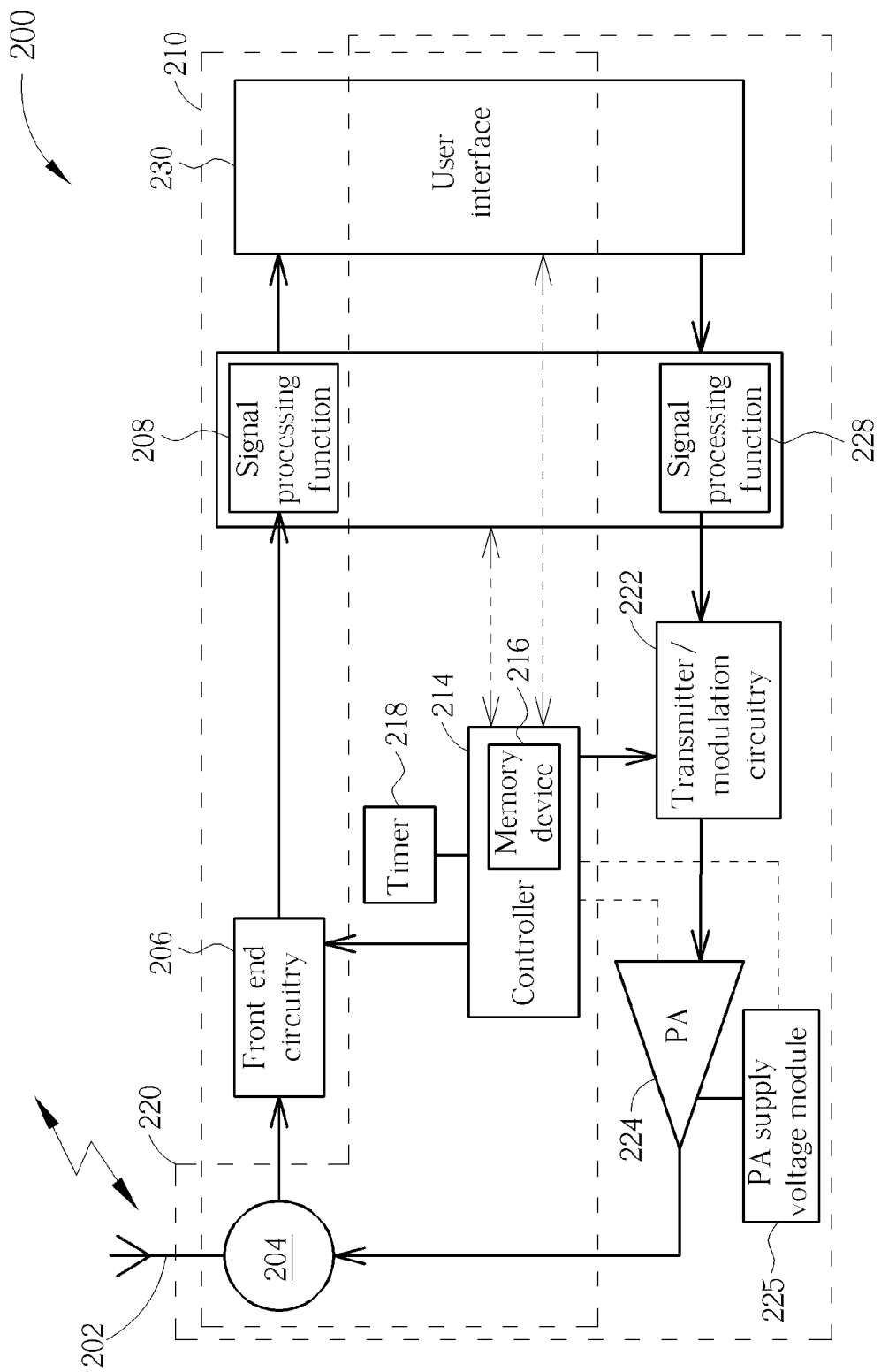
FIG. 2 illustrates a simplified block diagram of an example of a wireless communication unit.

Referring first to FIG. 2, a block diagram of a wireless communication unit (sometimes referred to as a mobile subscriber unit (MS) in the context of cellular communications or a user equipment (UE) in terms of a 3$^{rd}$ generation partnership project (3GPP™) communication system) is shown, in accordance with one example embodiment of the invention. The wireless communication unit 200 contains an antenna 202 preferably coupled to a duplex filter or antenna switch 204 that provides isolation between receive and transmit chains within the wireless communication unit 200.

The receiver chain 210, as known in the art, includes receiver front-end circuitry 206 (effectively providing reception, filtering and intermediate or base-band frequency conversion). The front-end circuitry 206 is coupled to a signal processing function 208. An output from the signal processing function 208 is provided to a suitable user interface 230, which may encompass a screen or flat panel display. A controller 214 maintains overall subscriber unit control and is coupled to the receiver front-end circuitry 206 and the signal processing function 208 (generally realised by a digital signal processor (DSP)). The controller 214 is also coupled to a memory device 216 that selectively stores various operating regimes, such as decoding/encoding functions, synchronisation patterns, code sequences, and the like.

In accordance with examples of the invention, the memory device 216 stores modulation data, and power supply data for use in supply voltage control to track the envelope of the radio frequency waveform to be output by the wireless communication unit 200. Furthermore, a timer 218 is operably coupled to the controller 214 to control the timing of operations (transmission or reception of time-dependent signals and in a transmit sense the time domain variation of the PA supply voltage within the wireless communication unit 200).

As regards the transmit chain 220, this essentially includes the user interface 230, which may encompass a keypad or touch screen, coupled in series via signal processing function 228 to transmitter/modulation circuitry 222. The transmitter/modulation circuitry 222 processes input signals for transmission and modulates and up-converts these signals to a radio frequency (RF) signal for amplifying in the power amplifier module or integrated circuit 224. RF signals amplified by the PA module or PA integrated circuit 224 are passed to the antenna 202. The transmitter/modulation circuitry 222, power amplifier 224 and PA supply voltage module 225 are each operationally responsive to the controller 214, with the PA supply voltage module 225 additionally responding to a reproduction of the envelope modulated waveform from the transmitter/modulation circuitry 222.

The signal processing function 228 in the transmit chain 220 may be implemented as distinct from the signal processing function 208 in the receive chain 210. Alternatively, a single processor may be used to implement processing of both transmit and receive signals, as shown in FIG. 2. Clearly, the various components within the wireless communication unit 200 can be realised in discrete or integrated component form, with an ultimate structure therefore being merely an application-specific or design selection.

Furthermore, in accordance with examples of the invention, the transmitter/modulation circuitry 222, together with power amplifier 224, PA supply voltage 225, memory device 216, timer function 218 and controller 214 have been adapted to generate a power supply to be applied to the PA 224. For example, a power supply is generated that is suitable for a wideband linear power amplifier, and configured to track the envelope waveform applied to the PA 224.

Figure 3:
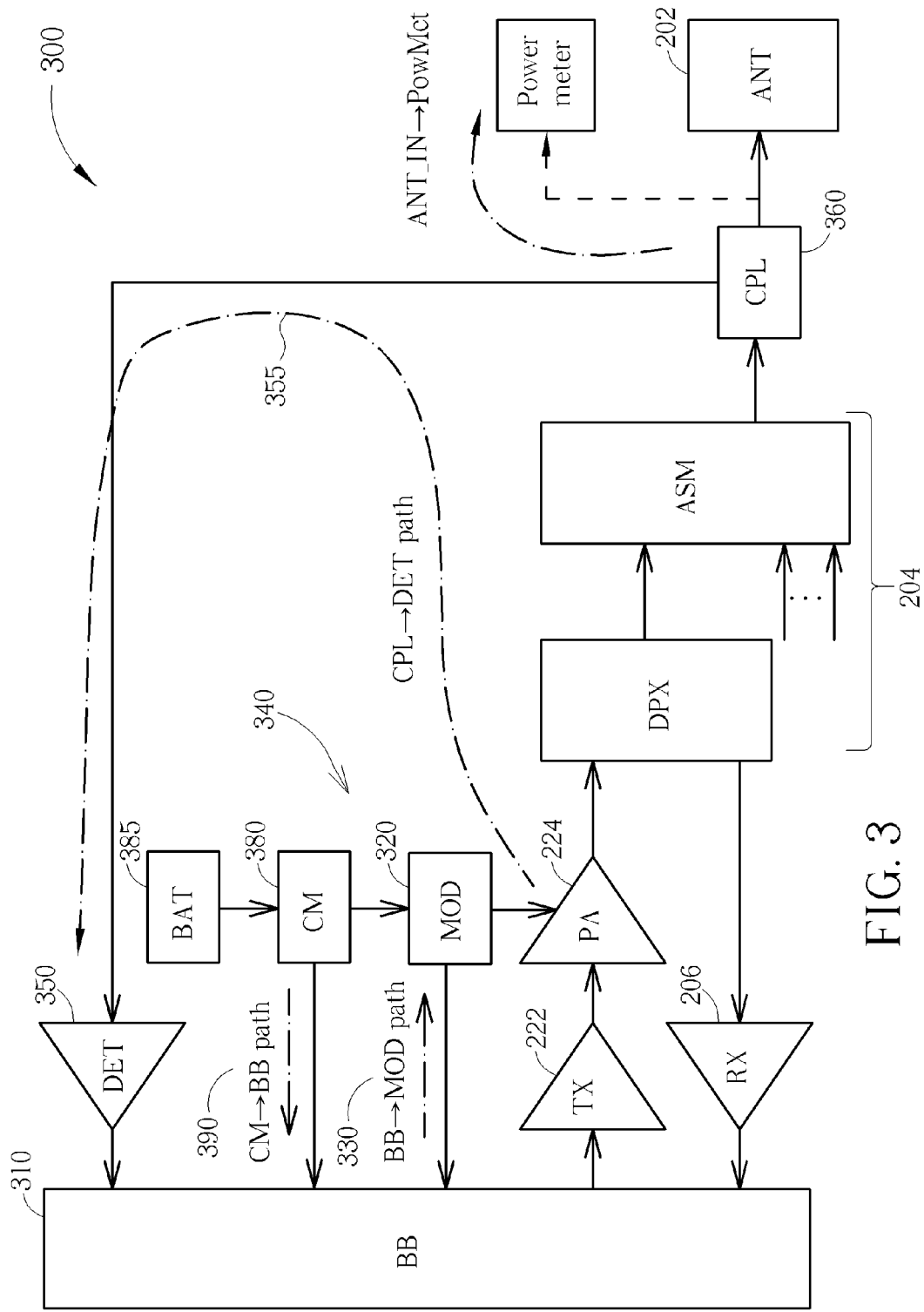
FIG. 3 illustrates a simplified generic block diagram of an example of a part of an RF transceiver architecture.

Referring now to FIG. 3, there is illustrated a generic example block diagram of a part of an RF transceiver architecture 300 of a wireless communication unit, such as the wireless communication unit 200 illustrated in FIG. 2. The RF transceiver architecture 300 may be implemented within one or more integrated circuit devices. In the transmit direction, the transceiver architecture 300 comprises transmitter/modulation circuitry (TX) 222 operably coupled between baseband component (BB) 310, for example residing within the signal processing function 228 and/or the controller 214 of FIG. 2, and a PA module 224. The PA module 224 is operably coupled to the antenna (ANT) 202 via a duplex filter (DPX) and an antenna switch module (ASM), illustrated generally at 204. A PA supply voltage modulator (MOD) 320 is arranged to modulate the supply voltage to the PA module 224 in accordance with an instantaneous voltage supply signal received from the baseband component 310 via a baseband to PA supply voltage modulator (BB to MOD) path 330. The interface used by the BB to MOD path 330 can be analogue or digital, and the control signals may be static or dynamic (i.e. follow the instantaneous envelope of the PA RF signal). In this manner, the PA supply voltage modulator 320, BB to MOD path 330 and corresponding part(s) of the baseband component 310 may be configured to perform envelope tracking modulation of the supply voltage provided to the PA module 224 such that the supply voltage provided to the PA module 224 substantially tracks an envelope of an RF waveform being amplified by the PA module 224. Accordingly, the PA supply voltage modulator 320, BB to MOD path 330 and corresponding part(s) of the baseband component 310 may form (at least a part of) an envelope tracking system 340 of the transceiver architecture 300. In the receive direction, the transceiver architecture 300 comprises receiver front-end circuitry (RX) 206 operably coupled between the duplex filter and a further baseband component 310, for example residing in the signal processing function 208 and/or the controller 214 of FIG. 2.

As previously mentioned, the mapping function between the envelope of the RF waveform being amplified and the modulation of the PA supply voltage (VPA) is critical for optimum performance (efficiency, gain, and adjacent channel power (ACP)). To this end, in the illustrated example, the transceiver architecture 300 illustrated in FIG. 3 further comprises a detection component (DET) 350 arranged to receive an indication of an output of the PA module 224 via a detection feedback path (CPL to DET) 355, and to enable the detection of the mapping and alignment of the envelope tracking system, as described in greater detail below.

In the illustrated example, the detection component 350 is illustrated as comprising a discrete component within the transceiver architecture 300, arranged to receive an indication of an output signal of the PA module 224, and to output an indication of a detected output power of the PA module 224 to a baseband component 310, for example residing within the controller 214 of FIG. 2. The detection component 350 may comprise functionality such as amplification, down-mixing, analogue-to-digital conversion, etc. In the illustrated example, the detection component 350 is operably coupled to an antenna coupler (CPL) 360, and arranged to receive an indication of the output signal of the PA module 224 in the form of the RF signal provided to the antenna 202. Advantageously, by using the RF signal provided to the antenna 202 as the indication of the output signal of the PA module 224 in this manner, variations within the duplex filter and antenna switch module 204 may also be compensated for during any calibration subsequently performed based on the detected output power signal generated by the detection component 350.

It will be apparent that the present invention is not limited to the specific example transceiver architecture 300 illustrated in FIG. 3, and may equally be applied to other transceiver architectures. For example, in some alternative architectures the detection component 350 may be operably coupled directly to the output of the PA module 224 and arranged to receive an indication of the output signal of the PA module 224 substantially directly. In some further alternative architectures the detection component 350 may be at least partially merged within the receiver front-end circuitry 206, and arranged to receive an indication of the output signal of the PA module 224 via the duplex filter. In this manner, the detection component 350 could re-use at least some of the functionality of the receiver front-end circuitry 206 such as ADCs, baseband functionality, etc.

In the illustrated example a current monitor component (CM) 380 is provided between a battery (BAT) 385 of the wireless communication unit 200 and the PA supply voltage modulator 320. The current monitor component 380 is arranged to provide an indication of the current flow from the battery 385 to the PA supply voltage modulator 320 to the baseband component 310 via a current monitor to baseband (CM to BB) path 390.

Figure 4:
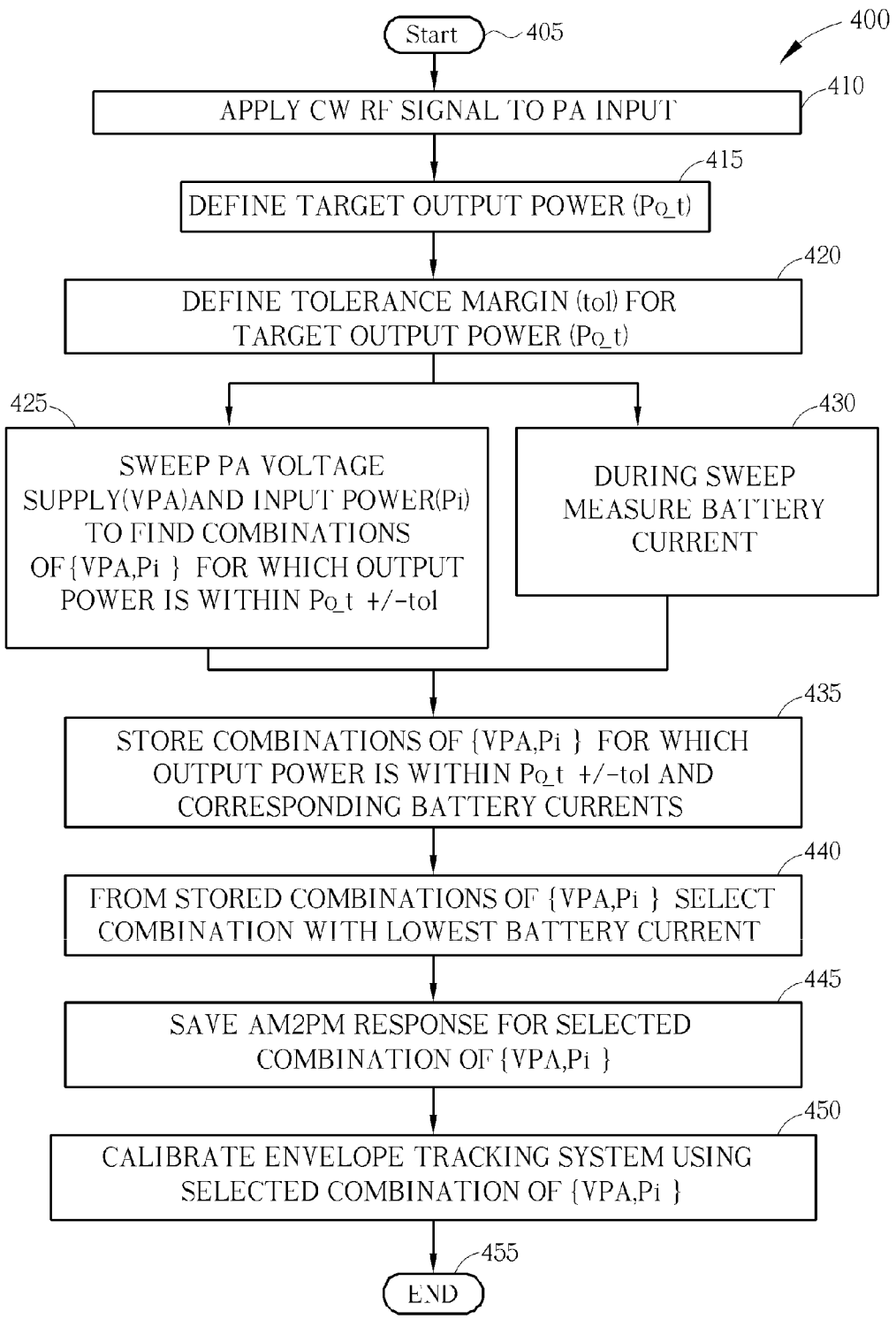
FIG. 4 illustrates a simplified flowchart of an example of a method of calibrating at least a part of an envelope tracking system within an RF transceiver.

Referring now to FIG. 4, there is illustrated a simplified flowchart 400 of an example of a method of calibrating an envelope tracking system for a supply voltage for a power amplifier module within an RF transmitter module of a wireless communication unit, such as the envelope tracking system 340 of FIG. 3. In the example transceiver architecture 300 illustrated in FIG. 3, the method of FIG. 4 may be implemented as least partly within the baseband component 310, for example within at least one signal processing module.

The method of FIG. 4 starts at 405 and moves on to step 410 where, in the example illustrated in FIG. 4, a continuous wave (CW) RF signal is applied to an input of the power amplifier module. For example, in the example architecture of FIG. 3, the baseband component 310 may be configured to apply a continuous wave signal to the input of the transmitter/modulation circuitry 222. The transmitter/modulation circuitry 222 may then upconvert the received continuous wave signal and provide the continuous wave RF signal to the power amplifier 224 for amplification and subsequent output to the antenna 202, via the duplex filter and antenna switch module 204, for transmission.

Referring back to FIG. 4, the illustrated method further comprises defining a target output power (Po_t) at step 415. A tolerance margin (tol) for the target output power (Po_t) is also defined in the illustrated example at step 420. For example, a tolerance margin (tol) for the target output power (Po_t) may be defined such that, during modulated user data transmission an instantaneous output power within the tolerance margin does not degrade the adjacent channel leakage ratio (ACLR) or error vector magnitude (EVM) characteristics for the RF transmitter module.

Combinations of the power amplifier supply voltage (VPA) and power amplifier input power (Pi) that provide a power amplifier output power (Po) substantially equal to the target output power (Po_t) are then determined. In particular in the illustrated example, combinations of the power amplifier supply voltage (VPA) and power amplifier input power (Pi) that provide a power amplifier output power (Po) substantially within a tolerance range of the target output power (Po_t); e.g. within the range of the target output power (Po_t)+/−the defined tolerance margin (tol) are determined. Such combinations of the power amplifier supply voltage (VPA) and power amplifier input power (Pi) may be determined by way of varying at least one of the power amplifier supply voltage (VPA) and power amplifier input power (Pi). In the example illustrated in FIG. 4, such combinations of the power amplifier supply voltage (VPA) and power amplifier input power (Pi) are determined by way of sweeping the power amplifier supply voltage (VPA) and power amplifier input power (Pi), at step 425.

Referring back to FIG. 3, the combinations of the power amplifier supply voltage (VPA) and power amplifier input power (Pi) that provide a power amplifier output power (Po) equal to the target output power (Po_t), and more specifically in the illustrated example within a tolerance range of the target output power (Po_t), may be determined within the baseband component 310 by way of monitoring at least an indication of the output power of the power amplifier module 224 by way of the detection feedback path (CPL to DET) 355 and detection component 350.

Referring back to FIG. 4, the method further comprises obtaining battery current indications for the determined combinations of the power amplifier supply voltage (VPA) and power amplifier input power (Pi) that provide a power amplifier output power (Po) equal to the target output power (Po_t), and more specifically in the illustrated example within a tolerance range of the target output power (Po_t). For example, and as illustrated at step 430, battery current measurements may be obtained during the sweep of the power amplifier supply voltage (VPA) and power amplifier input power (Pi) performed in step 425.

Referring back to FIG. 3, one or more current measurement components, such as the current measurement component 380 illustrated in FIG. 3, may be arranged to measure current flow from a battery 385 of the wireless communication unit to one or more components within the RF transmitter module, such as the PA supply voltage modulator 320, the PA module 224, the RF transmitter/modulation circuitry 222, etc. as illustrated in FIG. 3. The current measurement component(s) 380 may then provide at least indications of current flow measurements to the baseband component 310 via a current measurement to baseband (CM to BB) path 390.

It will be appreciated that the present invention is not limited to measuring the battery current to only the PA supply voltage modulator 320, the PA module 224 and/or transmitter/modulation circuitry 222, and it is contemplated that the battery current to any other components within the transceiver architecture 300 and/or the wireless communication unit 200 may additionally/alternatively be measured in order to provide an indication of the efficiency of the transceiver architecture 300 and/or the wireless communication unit 200 under a present configuration.

Referring back to FIG. 4, in the illustrated example the combinations of the power amplifier supply voltage (VPA) and power amplifier input power (Pi) that provide a power amplifier output power (Po) equal to the target output power (Po_t), and more specifically in the illustrated example within a tolerance range of the target output power (Po_t), are stored, along with the respective battery current measurement indications therefore, at step 435. From these stored combinations a combination of the power amplifier supply voltage (VPA) and power amplifier input power (Pi) is selected based at least partly on the respective battery current measurement indication(s) therefore. For example, a combination of the power amplifier supply voltage (VPA) and power amplifier input power (Pi) comprising a lowest battery current therefore may be selected.

Significantly, by reducing the PA supply voltage (VPA), the current consumption of the PA module 224 may be reduced, thereby increasing the efficiency of the PA. Accordingly, by monitoring the battery current to the PA module 224, a combination of the power amplifier supply voltage (VPA) and power amplifier input power (Pi) may be selected that comprises a low battery PA module battery current, and thus that comprises an efficient operation of the PA module for a target output power (Po_t).

Reducing the PA supply voltage (VPA) results in a drop in the gain of the PA module 224. As such, in order to achieve a required output power for the PA module 224, the input power to the PA module 224 is required to be increased. Such an increase in the input power to the PA module 224 results in an increase in the current drawn by the transmitter/modulation circuitry 222. Thus, in order to obtain a minimum combined current for the PA module 224 and the transmitter/modulation circuitry 222, a balance between reducing the PA supply voltage (VPA) to reduce the current consumption of the PA module 224 and a corresponding increase in the input power to the PA module 224 resulting in an increase in the current consumption of the transmitter/modulation circuitry 222 is required to be found. Accordingly, by monitoring the battery current to both the PA module 224 and the transmitter/modulation circuitry 222, a combination of the power amplifier supply voltage (VPA) and power amplifier input power (Pi) may be selected that achieves a minimum combined current for the PA module 224 and the transmitter/modulation circuitry 222, and thus that comprises an efficient operation of the overall transceiver architecture for a target output power (Po_t).

The amplitude modulation to phase modulation (AM2PM) response for the selected combination may then be saved, as illustrated at step 445, to enable digital pre-distortion to be performed (e.g. within the baseband component 310) during subsequent data transmission by the RF transmitter module to compensate for any phase modulation introduced by the PA module 224.

The envelope tracking system may then be calibrated (for example a lookup table populated) using the selected combination of the power amplifier supply voltage (VPA) and power amplifier input power (Pi) for the target output power (Po_t), at step 450. The method then ends at 455.

Figure 5:
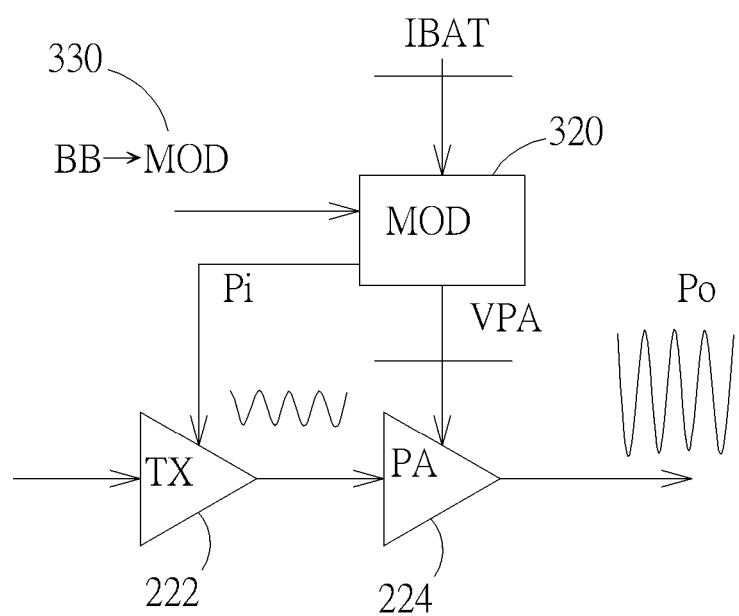
FIGS. 5 and 6 illustrate an example of the method of calibrating an envelope tracking system of FIG. 4
Figure 6:
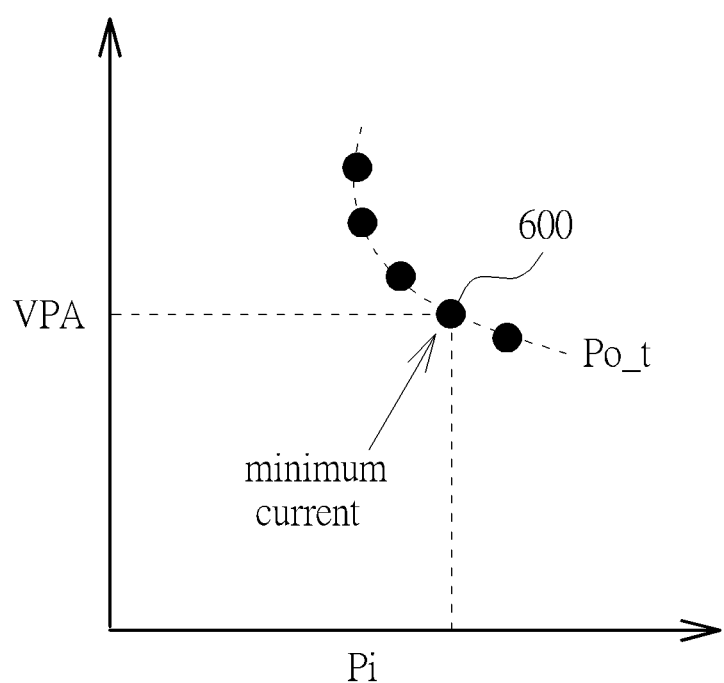

FIGS. 5 and 6 illustrate an example of the method of calibrating an envelope tracking system of FIG. 4. As illustrated in FIG. 5, the PA supply voltage modulator 320 modulates the power amplifier supply voltage (VPA) provided to the PA module 224 in accordance with a constant VPA waveform signal received via the BB to MOD path 330 (from the baseband component 310 in the example illustrated in FIG. 3). The PA module 224 accordingly amplifies a continuous wave RF signal received from the transmitter/modulation circuitry 222 in accordance with the received power amplifier supply voltage (VPA). FIG. 6 illustrates a simplified graph showing an example of combinations of the power amplifier supply voltage (VPA) and power amplifier input power (Pi) that provide a power amplifier output power (Po) equal to (or within the tolerance margin (tol) of) a target output power (Po_t). In the example illustrated in FIG. 6, five combinations of the power amplifier supply voltage (VPA) and power amplifier input power (Pi) that provide a power amplifier output power (Po) equal to (or within the tolerance margin (tol) of) a target output power (Po_t) are shown. From these five combinations, the one with lowest battery current consumption is selected, as illustrated at 600. Note that for a given target output power (Po_t), both the power amplifier supply voltage (VPA) and the envelope of the RF signal are constant.

Figure 7:
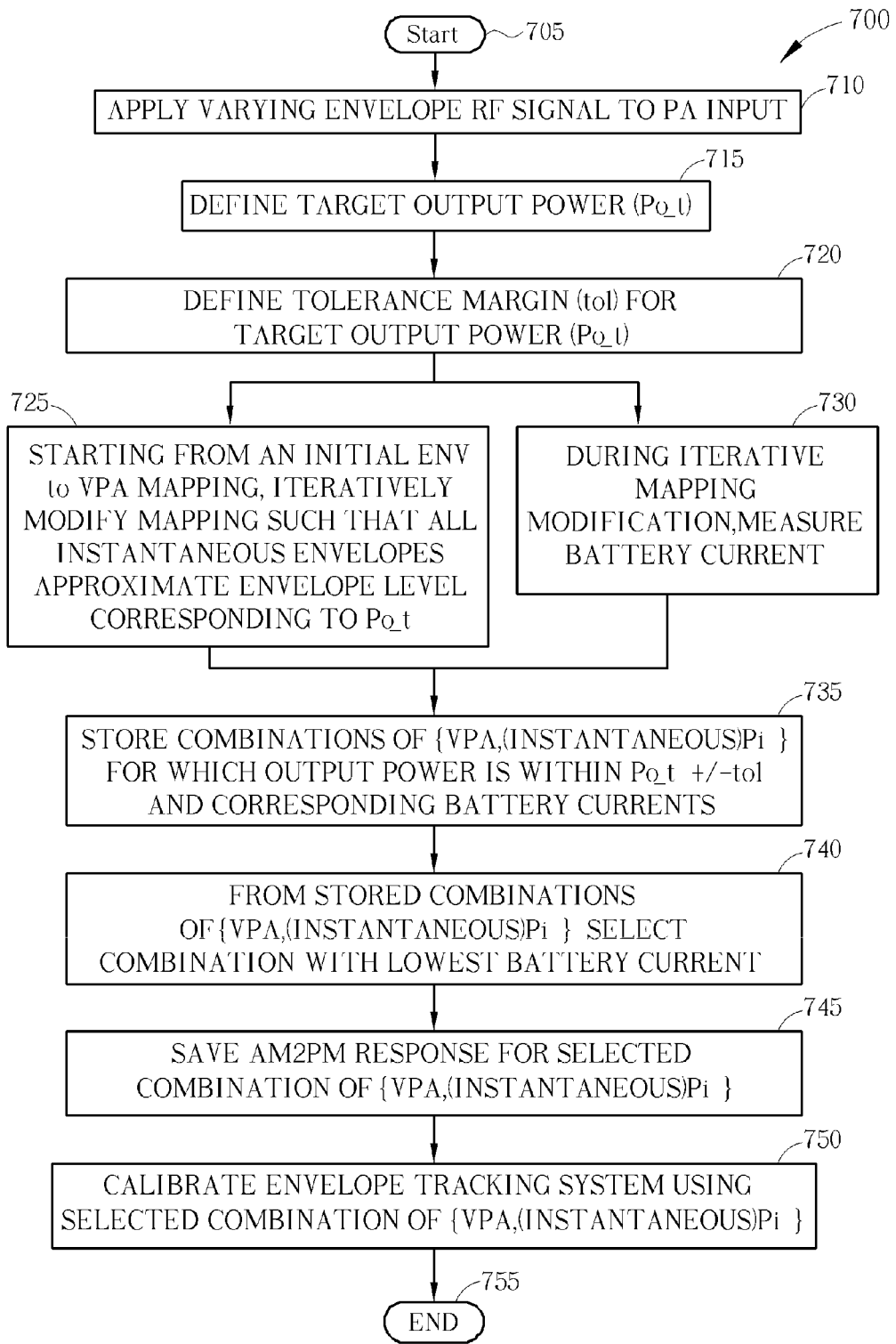
FIG. 7 illustrates a simplified flowchart of an alternative example of a method of calibrating at least a part of an envelope tracking system within an RF transceiver.

Referring now to FIG. 7, there is illustrated a simplified flowchart 700 of an example of an alternative method of calibrating an envelope tracking system for a supply voltage for a power amplifier module within an RF transmitter module of a wireless communication unit, such as the envelope tracking system 340 of FIG. 3. In the example transceiver architecture 300 illustrated in FIG. 3, the method of FIG. 7 may be implemented as least partly within the baseband component 310, for example within at least one signal processing module.

The method of FIG. 7 starts at 705 and moves on to step 710 where, in the example illustrated in FIG. 7, a varying envelope RF signal is applied to an input of the power amplifier module. For example, in the example architecture of FIG. 3, the baseband component 310 may be configured to apply a varying envelope signal to the input of the transmitter/modulation circuitry 222. The transmitter/modulation circuitry 222 may then upconvert the received varying envelope signal and provide the modulated varying envelope RF signal to the power amplifier 224 for amplification and subsequent output to the antenna 202, via the duplex filter and antenna switch module 204, for transmission.

Referring back to FIG. 7, the illustrated method further comprises defining an instantaneous target output power (Po_t) at step 715. A tolerance margin (tol) for the instantaneous target output power (Po_t) is also defined in the illustrated example at step 720. For example, a tolerance margin (tol) for the instantaneous target output power (Po_t) may be defined such that an output power within the tolerance margin does not degrade the adjacent channel leakage ratio (ACLR) or error vector magnitude (EVM) characteristics for the RF transmitter module.

In the example method illustrated in FIG. 7, an RF signal envelope ENV to amplifier supply voltage VPA (ENV to VPA) mapping is obtained such that an instantaneous power amplifier output power Po equals (or within the tolerance margin (tol) of) the instantaneous target output power Po_t. In particular, in the illustrated example an initial ENV to VPA mapping is iteratively modified to achieve an instantaneous power amplifier output power Po that equals (or within the tolerance margin (tol) of) the instantaneous target output power Po_t, at step 725. It will be appreciated that the ENV to VPA mapping may be non-linear as the input signal may be distorted due to non-linear gain of the power amplifier module.

Referring back to FIG. 3, the ENV to VPA mapping may be iteratively modified to achieve an instantaneous power amplifier output power Po that equals (or within the tolerance margin (tol) of) the instantaneous target output power Po_t by the baseband component 310 by way of monitoring at least an indication of the instantaneous output power of the power amplifier module 224 by way of the detection feedback path (CPL to DET) 355 and detection component 350.

The method of FIG. 7 further comprises obtaining battery current indications for the determined combinations of the power amplifier supply voltage (VPA) and power amplifier input power (Pi) that provide an instantaneous power amplifier output power (Po) equal to the instantaneous target output power (Po_t), and more specifically in the illustrated example within a tolerance range of the instantaneous target output power (Po_t). For example, and as illustrated at step 730, battery current measurements may be obtained during the iterative modification of the ENV to VPA mapping performed at step 725.

Referring back to FIG. 3, and as outlined above in relation to the method of FIG. 4, one or more current measurement components, such as the current measurement component 380 illustrated in FIG. 3, may be arranged to measure current flow from a battery 385 of the wireless communication unit to one or more components within the RF transmitter module, such as the PA supply voltage modulator 320, the PA module 224, the RF transmitter/modulation circuitry 222, etc. as illustrated in FIG. 3. The current measurement component(s) 380 may then provide at least indications of current flow measurements to the baseband component 310 via a current measurement to baseband (CM to BB) path 390.

Referring back to FIG. 7, in the illustrated example combinations of the power amplifier supply voltage (VPA) and instantaneous power amplifier input power (Pi) that provide a power amplifier output power (Po) equal to the instantaneous target output power (Po_t), and more specifically in the illustrated example within a tolerance range of the instantaneous target output power (Po_t), may be determined from the modified ENV to VPA mapping, and are stored, along with the respective battery current measurement indications therefore, at step 735. From these stored combinations, a combination of the power amplifier supply voltage (VPA) and instantaneous power amplifier input power (Pi) is selected based at least partly on the respective battery current measurement indication(s) therefore. For example, a combination of the power amplifier supply voltage (VPA) and instantaneous power amplifier input power (Pi) comprising a lowest battery current therefore, and in particular for for the PA module 224 and the transmitter/modulation circuitry 222 in some examples, may be selected.

The amplitude modulation to phase modulation (AM2PM) response for the selected combination may then be saved, as illustrated at step 745, to enable digital pre-distortion to be performed (e.g. within the baseband component 310) during subsequent data transmission by the RF transmitter module to compensate for any phase modulation introduced by the PA module 224.

The envelope tracking system may then be calibrated (e.g. a lookup table populated) using the selected combination of the power amplifier supply voltage (VPA) and instantaneous power amplifier input power (Pi) for the instantaneous target output power (Po_t), at step 750. The method then ends at 755.

Figure 8:
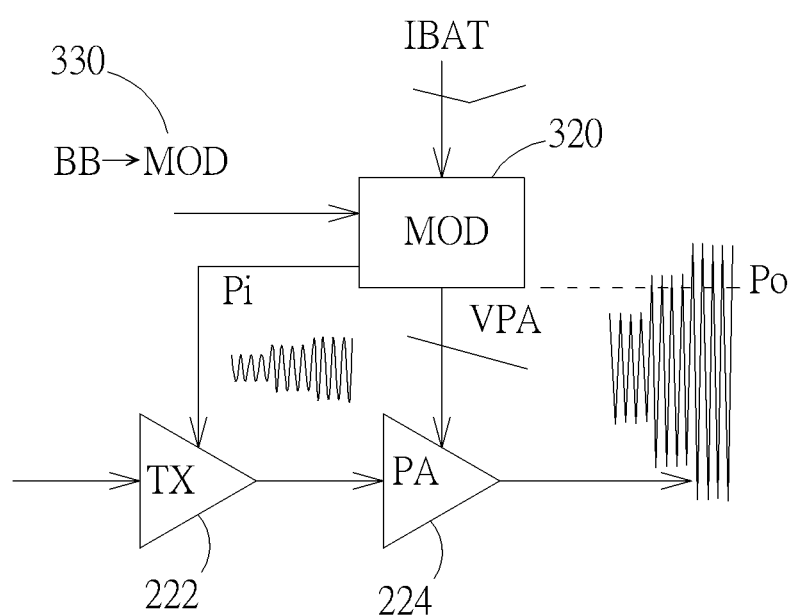
FIGS. 8 and 9 illustrate an example of the method of calibrating an envelope tracking system of FIG. 7.
Figure 9:
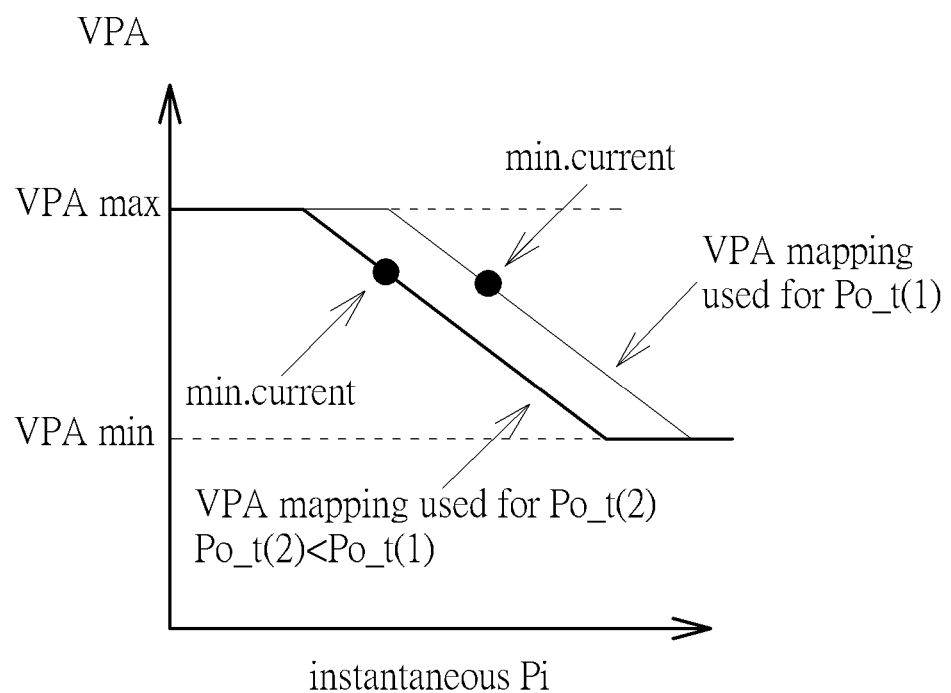

FIGS. 8 and 9 illustrate an example of the method of calibrating an envelope tracking system of FIG. 7. As illustrated in FIG. 8, the PA supply voltage modulator 320 modulates the power amplifier supply voltage (VPA) provided to the PA module 224 in accordance with a varying VPA waveform signal received via the BB to MOD path 330 (from the baseband component 310 in the example illustrated in FIG. 3). The PA module 224 accordingly amplifies a modulated varying envelope RF signal received from the transmitter/modulation circuitry 222 in accordance with the received varying power amplifier supply voltage (VPA). FIG. 9 illustrates a simplified graph showing examples of ENV to VPA mappings 910, 920 for two target output power levels Po_t(1) and Po_t(2). In the example method illustrated in FIGS. 7 to 9, the power amplifier supply voltage (VPA), the envelope (ENV) of the RF signal and the battery current are varying. When the power amplifier supply voltage (VPA) rails to a maximum (VPA max) or minimum (VPA min) value, it means that the instantaneous input power is too low or too high respectively to be able to achieve the target instantaneous output power (Po_t). Following the modification at step 725 of each ENV to VPA mapping 910, 920 to achieve a respective instantaneous power amplifier output power that equals (or within the tolerance margin (tol) of) the instantaneous target output power, Po_t(1) and Po_t(2) respectively, a combination of the power amplifier supply voltage (VPA) and instantaneous power amplifier input power (Pi) comprising a lowest battery current therefore may be selected from each of the ENV to VPA mappings 910, 920.

It will be appreciated by a person skilled in the art that the methods of FIGS. 4 and 7 may be performed for each target output power level of interest, such that a combination of the power amplifier supply voltage (VPA) and (instantaneous) power amplifier input power (Pi) comprising a lowest battery current therefore may be selected and configured for each target output power level of interest.

Figure 10:
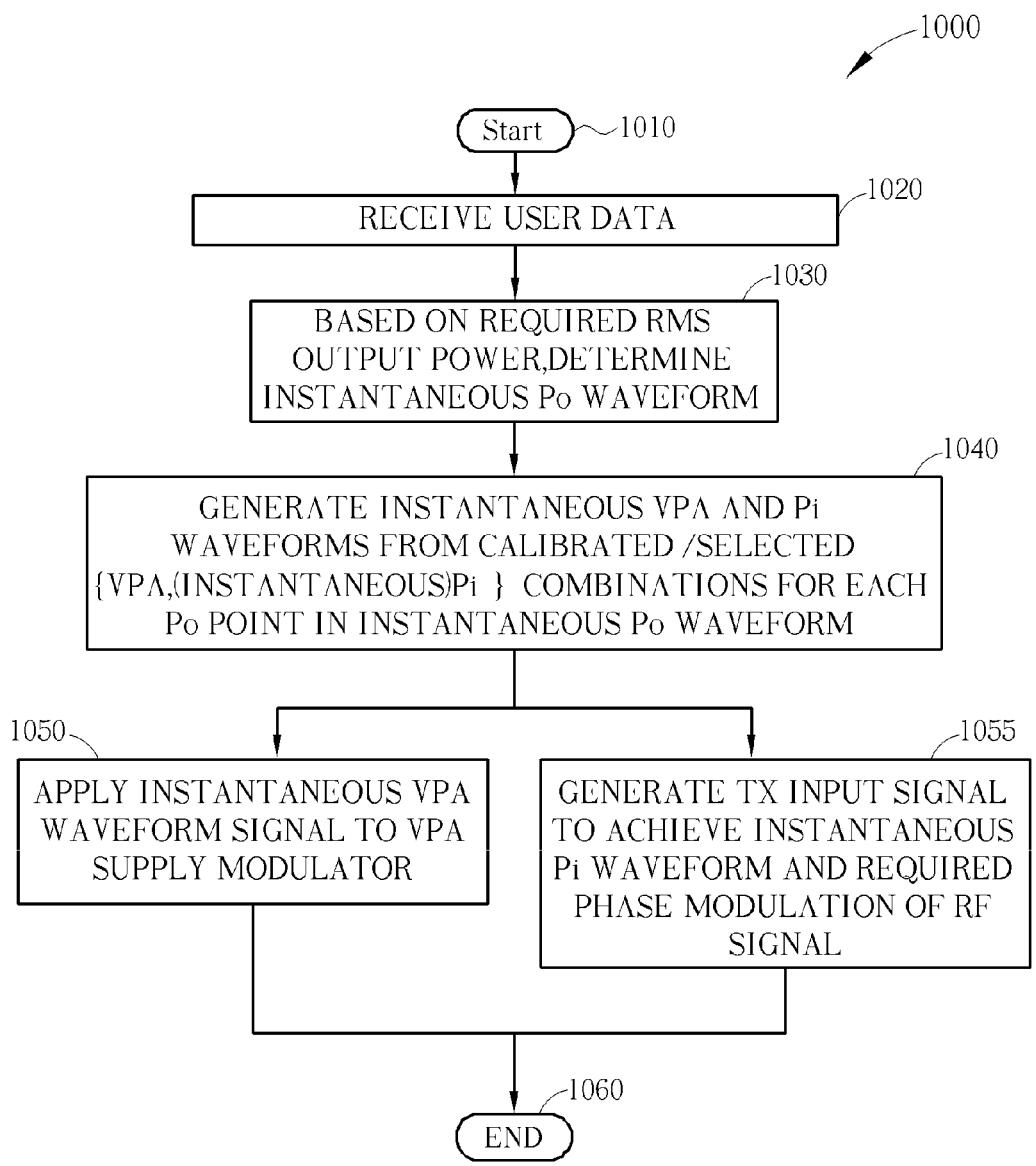
FIG. 10 illustrates a simplified flowchart of an example of a method of modulating a supply voltage for a power amplifier module within a radio frequency, RF, transmitter module of a wireless communication unit.

Referring now to FIG. 10, there is illustrated a simplified flowchart 1000 of an example of a method of modulating a supply voltage for a power amplifier module within a radio frequency, RF, transmitter module of a wireless communication unit, such as may be implemented within the transceiver architecture 300 of FIG. 3. The method starts at 1010 and moves on to step 1020 with the receipt of user data to be transmitted by the transmitter module of the wireless communication unit. Next, at step 1030, the method of the illustrated example comprises determining an output power waveform for the received user data, for example based on a required RMS output power as may be specified by a cellular network control system with which the transceiver is communicating. The method then moves on to step 1040 where a power amplifier supply voltage VPA waveform signal and a PA input power (Pi) waveform signal are generated from combinations of power amplifier supply voltage VPA and power amplifier input power Pi {VPA, (instantaneous) Pi} calibrated/selected in accordance with, for example, the methods of FIG. 4 or of FIG. 7, for individual points within the output power waveform.

The power amplifier supply voltage VPA waveform signal is then applied to a voltage supply modulator for the power amplifier module, at step 1050. In this manner, the voltage supply modulator for the power amplifier module is controllable to generate a corresponding VPA signal provided to a voltage supply port of the power amplifier modulator. Substantially in parallel, a transmitter input signal (for example provided to the input of the transmitter/modulation circuitry 222 and generated by the baseband component 310 in the example illustrated in FIG. 3) is generated to achieve the input power Pi waveform and required phase modulation of the RF signal and provided to an RF input port of the power amplifier module. The method then ends at 1060.

In this manner, power amplifier supply voltage VPA and power amplifier input power Pi waveforms may be generated based on minimum (or at least low) current {VPA, (instantaneous) Pi} combinations calibrated/selected in accordance with, for example, the methods of FIG. 4 or of FIG. 7, enabling the efficiency of the transmitter, and in particular in the illustrated example the PA module 224 and transmitter/modulation circuitry 222, to be substantially optimised.

Thus, a method and apparatus have been herein described in which an envelope tracking system is calibrated using a combination of the power amplifier supply voltage VPA and power amplifier input power Pi that have been selected to achieve a minimum (or at least low) battery current, and thus which provide a more efficient mapping between an instantaneous envelope of a waveform signal to be amplified by the power amplifier module and the power amplifier module supply voltage. Specifically, such envelope tracking system calibration comprises calibration of not just the power amplifier supply voltage VPA, but also of the power amplifier input power (Pi), thereby enabling the efficiency of not just the power amplifier module but also other components within the transmitter architecture such as, in the illustrated example, the transmitter/modulation circuitry.

As will be appreciated by a person skilled in the art, in the example methods of FIGS. 4 and 7, pre-distortion in the envelope (AM) domain between the power amplifier supply voltage VPA waveform and the input power Pi waveform signals is provided through the individual storing of combinations of the power amplifier supply voltage (VPA) and power amplifier input power (Pi) that provide a power amplifier output power (Po) equal to the target output power (Po_t), and the subsequent calibration/selection of the combination of the power amplifier supply voltage (VPA) and power amplifier input power (Pi) that comprises the lowest battery current for each target output power (Po_t).

In some example embodiments, it is contemplated that pre-distortion in the phase (PM) domain may also be applied to the transmitter input signal generated at step 1055 in the method of FIG. 10; such phase pre-distortion enabling phase distortion added by, for example, the power amplifier module to be compensated for. Such pre-distortion in the phase domain may be provided through digital pre-distortion of the transmitter input signal within the baseband component.

In the foregoing specification, the invention has been described with reference to specific examples of embodiments of the invention. It will, however, be evident that various modifications and changes may be made therein without departing from the broader spirit and scope of the invention as set forth in the appended claims.

For example, the present invention has been described with reference to determining combinations of the power amplifier supply voltage (VPA) and power amplifier input power (Pi) that provide a power amplifier output power (Po) equal to a target output power (Po_t), and to selecting/configuring combinations of the power amplifier supply voltage (VPA) and power amplifier input power (Pi) that provide a power amplifier output power (Po) equal to a target output power (Po_t) based at least partly on the obtained battery current indications therefore; wherein such selected/calibrated combinations of the power amplifier supply voltage (VPA) and power amplifier input power (Pi) may subsequently be used to modulate an envelope tracking system.

However, it is contemplated that envelope values may equally be used instead of power values for implementing examples of the present invention. For example, it is contemplated that combinations of the power amplifier supply voltage (VPA) and power amplifier input envelope value (Ei) may be determined that provide a power amplifier output envelope value (Eo) equal to a target output envelope value (Eo_t), and such combinations of the power amplifier supply voltage (VPA) and power amplifier input envelope value (Ei) may be selected/configured based at least partly on the obtained battery current indications therefore; wherein such selected/calibrated combinations of the power amplifier supply voltage (VPA) and power amplifier input envelope value (Ei) may subsequently be used to modulate an envelope value tracking system. Advantageously, envelope values may be more convenient to calculate. Accordingly, any references herein to power values, including such references within the claims, are to be interpreted as covering envelope values as well.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the various components/modules, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method of calibrating an envelope tracking system for a supply voltage for a power amplifier module within a radio frequency (RF) transmitter module of a wireless communication unit; the method comprising, within at least one signal processing module of the wireless communication unit:
   determining combinations of the power amplifier supply voltage and power amplifier input power that provide a power amplifier output power equal to a target output power;
   obtaining battery current indications for the determined combinations of the power amplifier supply voltage and power amplifier input power that provide a power amplifier output power equal to a target output power;
   selecting a combination of the power amplifier supply voltage and power amplifier input power that provide a power amplifier output power equal to a target output power based at least partly on the obtained battery current indications therefore; and
   calibrating the envelope tracking system using the selected combination of the power amplifier supply voltage and power amplifier input power.

2. The method of claim 1, wherein the method comprises:
   selecting a combination of the power amplifier supply voltage and power amplifier input power that provide a power amplifier output power equal to a target output power comprising a lowest battery current therefore; and
   calibrating the envelope tracking system using the selected combination of the power amplifier supply voltage and power amplifier input power.

3. The method of claim 1, wherein the method comprises determining combinations of the power amplifier supply voltage and power amplifier input power that provide a power amplifier output power within a tolerance range of the target output power.

4. The method of claim 1, wherein the determining combinations of the power amplifier supply voltage and power amplifier input power that provide a power amplifier output power equal to a target output power comprises:
   applying a continuous wave RF signal to an input of the power amplifier module;
   varying at least one of the power amplifier supply voltage and power amplifier input power; and
   monitoring at least an indication of the output power of the power amplifier to determine combinations of the power amplifier supply voltage and power amplifier input power that provide a power amplifier output power equal to a target output power.

5. The method of claim 4, wherein the method comprises:
   applying a continuous wave RF signal to an input of the power amplifier module;
   sweeping at least one of the power amplifier supply voltage and power amplifier input power; and
   monitoring at least an indication of the output power of the power amplifier to determine combinations of the power amplifier supply voltage and power amplifier input power that provide a power amplifier output power equal to a target output power.

6. The method of claim 1, wherein determining combinations of the power amplifier supply voltage and power amplifier input power that provide a power amplifier output power equal to a target output power comprises:
   apply a varying envelope RF signal to an input of the power amplifier module;
   iteratively modifying an RF signal envelope to amplifier supply voltage mapping such that instantaneous power amplifier output power equals the target output power.

7. The method of claim 1, wherein the method comprises, for each target output power level of interest:
   determining combinations of the power amplifier supply voltage and power amplifier input power that provide a power amplifier output power equal to the target output power;
   obtaining battery current indications for the determined combinations of the power amplifier supply voltage and power amplifier input power that provide a power amplifier output power equal to a target output power;
   selecting a combination of the power amplifier supply voltage and power amplifier input power that provide a power amplifier output power equal to a target output power based at least partly on the obtained battery current indications therefore; and
   calibrating the envelope tracking system using the selected combination of the power amplifier supply voltage and power amplifier input power.

8. The method of claim 1, wherein method comprises measuring at least one battery current of the wireless communication unit to obtain the battery current indications for the determined combinations of the power amplifier supply voltage and power amplifier input power that provide a power amplifier output power equal to a target output power.

9. The method of claim 8, wherein the method comprises measuring at least one battery current for at least one of:
the power amplifier module;
a power amplifier supply voltage modulator; and
RF transmitter/modulation circuitry.

10. The method of claim 1, wherein the method comprises:
determining combinations of the power amplifier supply voltage and power amplifier input envelope that provide a power amplifier output envelope equal to a target output envelope;
obtaining battery current indications for the determined combinations of the power amplifier supply voltage and power amplifier input power envelope that provide a power amplifier output envelope equal to a target output envelope;
selecting a combination of the power amplifier supply voltage and power amplifier input envelope that provide a power amplifier output envelope equal to a target output envelope based at least partly on the obtained battery current indications therefore; and
calibrating the envelope tracking system using the selected combination of the power amplifier supply voltage and power amplifier input envelope.

11. A non-transitory computer program product comprising executable program code for calibrating an envelope tracking system for a supply voltage for a power amplifier module within a radio frequency (RF) transmitter module of a wireless communication unit, the executable program code operable for, when executed at a communication unit, performing the method of claim 1.

12. A communication unit comprising:
a radio frequency (RF) transmitter module comprising an envelope tracking system for a supply voltage for a power amplifier module within the RF transmitter module; and
at least one signal processing module for calibrating the envelope tracking system and arranged to:
determine combinations of the power amplifier supply voltage and power amplifier input power that provide a power amplifier output power equal to a target output power;
obtain battery current indications for the determined combinations of the power amplifier supply voltage and power amplifier input power that provide a power amplifier output power equal to a target output power;
select a combination of the power amplifier supply voltage and power amplifier input power that provide a power amplifier output power equal to a target output power based at least partly on the obtained battery current indications therefore; and
calibrate the envelope tracking system using the selected combination of the power amplifier supply voltage and power amplifier input power.

13. An integrated circuit for a communication unit comprising a radio frequency (RF) transmitter module comprising an envelope tracking system for a supply voltage for a power amplifier module within the RF transmitter module; wherein the integrated circuit comprises:
at least one signal processing module for calibrating the envelope tracking system and arranged to:
determine combinations of the power amplifier supply voltage and power amplifier input power that provide a power amplifier output power equal to a target output power;
obtain battery current indications for the determined combinations of the power amplifier supply voltage and power amplifier input power that provide a power amplifier output power equal to a target output power;
select a combination of the power amplifier supply voltage and power amplifier input power that provide a power amplifier output power equal to a target output power based at least partly on the obtained battery current indications therefore; and
calibrate the envelope tracking system using the selected combination of the power amplifier supply voltage and power amplifier input power.

14. A method of modulating a supply voltage for a power amplifier module within a radio frequency (RF) transmitter module of a wireless communication unit; the method comprising, within at least one signal processing module of the wireless communication unit:
receiving user data to be transmitted by the transmitter module of the wireless communication unit;
determining an output power waveform;
generating a power amplifier supply voltage waveform signal and a power amplifier input power waveform signal from combinations of power amplifier supply voltage and power amplifier input power calibrated in accordance with the method of claim 1 for individual points within the output power waveform;
applying the power amplifier supply voltage waveform signal to a voltage supply modulator for the power amplifier module; and
generating an input signal for the RF transmitter module to achieve the power amplifier input power waveform signal.

15. The method of claim 14, wherein the method further comprises applying pre-distortion in the phase domain to the input signal for the RF transmitter module.

16. A non-transitory computer program product comprising executable program code for modulating a supply voltage for a power amplifier module within a radio frequency (RF) transmitter module of a wireless communication unit, the executable program code operable for, when executed at a communication unit, performing the method of claim 14.

17. A communication unit comprising:
a radio frequency (RF) transmitter module comprising an envelope tracking system; the envelope tracking system comprising at least one signal processing module arranged to:
receive user data to be transmitted by the transmitter module of the wireless communication unit;
determine an output power waveform;
generate a power amplifier supply voltage waveform signal and a power amplifier input power waveform signal from combinations of power amplifier supply voltage and power amplifier input power calibrated in accordance with the method of claim 1 for individual points within the output power waveform;
apply the power amplifier supply voltage waveform signal to a voltage supply modulator for the power amplifier module; and
generate an input signal for the RF transmitter module to achieve the power amplifier input power waveform signal.

18. An integrated circuit for a communication unit comprising a radio frequency (RF) transmitter module comprising an envelope tracking system; the envelope tracking system comprising at least one signal processing module arranged to:

receive user data to be transmitted by the transmitter module of the wireless communication unit;

determine an output power waveform;

generate a power amplifier supply voltage waveform signal and a power amplifier input power waveform signal from combinations of power amplifier supply voltage and power amplifier input power calibrated in accordance with the method of claim 1 for individual points within the output power waveform;

apply the power amplifier supply voltage waveform signal to a voltage supply modulator for the power amplifier module; and generate an input signal for the RF transmitter module to achieve the power amplifier input power waveform signal.

* * * * *